(12) United States Patent  (10) Patent No.: US 7,795,797 B2
Kondo et al.  (45) Date of Patent:  Sep. 14, 2010

(54) PHOSPHOR WITH LAMINATED COATING, ITS MANUFACTURE METHOD AND LIGHT EMITTING DEVICE USING THE SAME

(75) Inventors: Kenichi Kondo, Hadano (JP); Shuichi Taya, Hadano (JP)

(73) Assignee: Stanley Electric Co., Ltd. (JP)

( * ) Notice: Subject to any disclaimer, the term of this patent is extended or adjusted under 35 U.S.C. 154(b) by 865 days.

(21) Appl. No.: 11/386,109

(22) Filed: Mar. 22, 2006

(65) Prior Publication Data

US 2006/0255713 A1  Nov. 16, 2006

(30) Foreign Application Priority Data

Mar. 23, 2005  (JP) .............................. 2005-083258

(51) Int. Cl.
  *H01J 1/62*  (2006.01)
  *H01J 63/04*  (2006.01)
(52) U.S. Cl. ...................... 313/503; 313/498; 427/189; 427/215; 428/403; 252/301.4 R
(58) Field of Classification Search ......... 313/486–512; 427/64, 157, 180, 189, 190, 193, 212, 215–219, 427/71; 252/301.4 R–301.4 H; 428/403–405
See application file for complete search history.

(56) References Cited

U.S. PATENT DOCUMENTS

| 3,714,490 | A | * | 1/1973 | Kell ............................ 313/408 |
| 3,767,459 | A | * | 10/1973 | Kingsley et al. ............ 427/157 |
| 4,339,501 | A | * | 7/1982 | Inoue et al. ................ 428/404 |
| 4,398,119 | A | * | 8/1983 | Dodds et al. ............... 313/466 |
| 4,855,189 | A | * | 8/1989 | Simopoulos et al. ........ 428/690 |
| 5,051,277 | A | * | 9/1991 | Sigai et al. .................... 427/69 |
| 5,087,523 | A | * | 2/1992 | Sigai et al. .................. 428/404 |
| 5,156,885 | A | * | 10/1992 | Budd ........................... 427/70 |
| 5,418,062 | A | * | 5/1995 | Budd .......................... 428/403 |
| 5,747,100 | A | * | 5/1998 | Petersen ....................... 427/64 |
| 5,958,591 | A | * | 9/1999 | Budd .......................... 428/403 |
| 6,077,458 | A | * | 6/2000 | Shiiki et al. ........... 252/301.4 R |
| 6,811,813 | B1 | * | 11/2004 | Tian ............................ 427/215 |
| 6,890,593 | B2 | * | 5/2005 | Tian ............................ 427/215 |
| 2003/0168669 | A1 | * | 9/2003 | Chua ............................ 257/98 |
| 2003/0198738 | A1 | * | 10/2003 | Tian ............................ 427/212 |
| 2005/0218468 | A1 | * | 10/2005 | Owen et al. ................. 257/433 |
| 2006/0012287 | A1 | * | 1/2006 | Tian et al. ................... 313/501 |

FOREIGN PATENT DOCUMENTS

| JP | 04-230996 | 8/1992 |
| JP | 2002-531956 | 9/2002 |
| JP | 2002-544365 | 12/2002 |
| WO | WO 00-33390 | 6/2000 |
| WO | WO 00-69986 | 11/2000 |
| WO | WO 02-091487 | 11/2002 |

\* cited by examiner

*Primary Examiner*—Nimeshkumar D Patel
*Assistant Examiner*—Thomas A Hollweg
(74) *Attorney, Agent, or Firm*—Chen Yoshimura LLP

(57) ABSTRACT

A phosphor made of phosphor particles coated with inorganic substance lamination, wherein an outermost layer is a transparent layer made of one or more of $SiO_2$, $Al_2O_3$ and SiON, having a thickness of about 10 nm to about 500 nm, and formed by fluidized bed CVD, and a transparent inner coating layer is formed inside the outermost layer by a method different from the fluidized bed CVD. The inner coating may be formed by nonaqueous method not using a water content, for example sintering super-fine particles distributed on phosphor particles.

7 Claims, 3 Drawing Sheets

FIG.1A
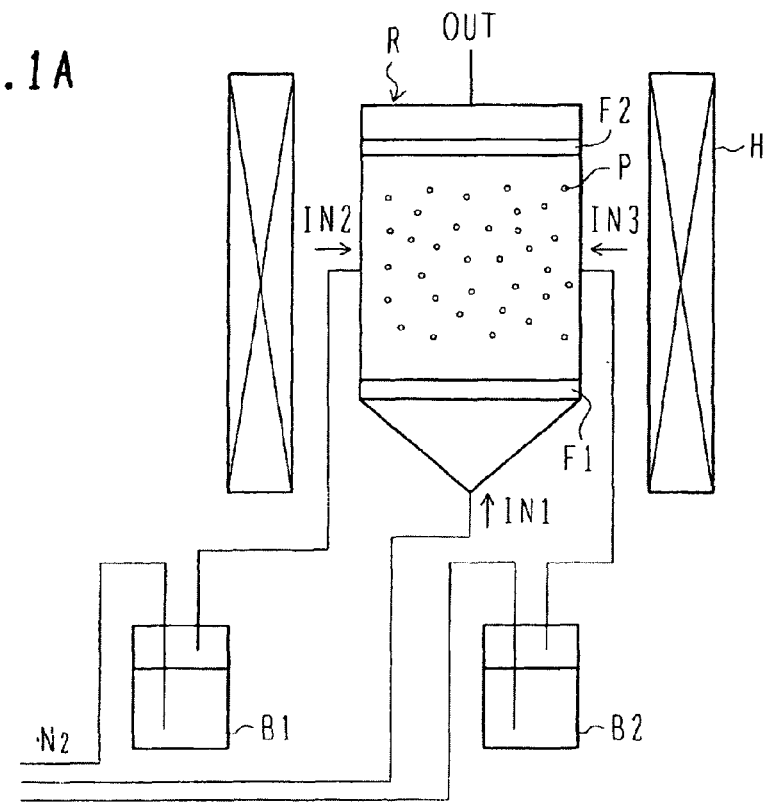
FIG.1B
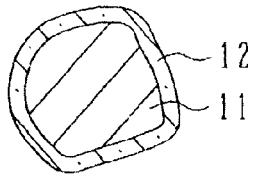
FIG.1C
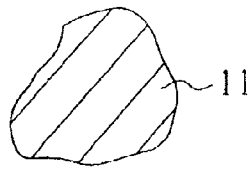
FIG.1D
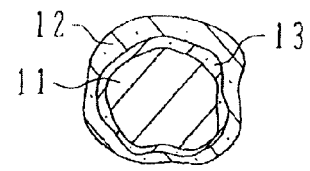
FIG.1E
| SAMPLE | $SiO_2$ COATING | | INITIAL | AFTER 545H | AFTER 1190H |
|---|---|---|---|---|---|
| S1 | FLUIDIZED BED CVD LAYER | 400 nm | 100% | 80% | 65% |
| S2 | NONE | | 100% | 65% | 50% |
| S3 | NONAQUEOUS METHOD LAYER | 20 nm | 100% | 95% | 80% |
|    | FLUIDIZED BED CVD LAYER | 400 nm | | | | ered

PHOSPHOR WITH LAMINATED COATING, ITS MANUFACTURE METHOD AND LIGHT EMITTING DEVICE USING THE SAME

CROSS REFERENCE TO RELATED APPLICATION

This application claims the benefit of Japanese Patent Application No. 2005-083258 filed in Japan on Mar. 23, 2005, the entire contents of which are incorporated herein by reference.

BACKGROUND OF THE INVENTION

A) Field of the Invention

The present invention relates to a phosphor, and more particularly, to a phosphor suitable for an illumination light emitting device using a light emitting diode, its manufacture method, and a light emitting device using a phosphor.

B) Description of the Related Art

With the development of blue light emitting diodes, white light sources using light emitting diodes are used widely. White light sources using light emitting diodes can be used as portable light sources, back lights for liquid crystal displays, and illumination light sources such as car headlights. Illumination light sources using light emitting diodes are becoming important along with display light emitting diodes. An illumination light source using a light emitting diode emits white light by using a combination of a blue light emitting diode emitting light at a wavelength of, e.g. about 460 nm, and a yellow phosphor such as yttrium aluminium garnet with Eu activator (YAG:Eu).

Since red light components of this light source are small, color rendering and color reproducibility are insufficient. For example, there is a tendency of insufficient color reproducibility in the case of a back light of a liquid crystal display. As a method of improving color reproducibility, there is a method of emitting lights of three colors, e.g., red, green, and blue, instead of light of two colors, blue and yellow.

International Publication No. WO2002/091487 proposes a white light source having high color rendering using a combination of a blue light emitting diode, YAG yellow phosphors and Eu complex red phosphors.

International Publication No. WO000/33390 (National Publication N0. 2002-531956) proposes a combination of a blue light emitting diode, green phosphors and red phosphors to emit white light having high color rendering, with light of three primary color wavelengths.

Phosphors are thus used to generate white light from a single kind of light emitting diode. Certain phosphors like sulfides lose their luminous intensity (luminance) when they are exposed to humidity. Several countermeasures against deterioration of phosphor properties due to humidity have been proposed.

Japanese Patent Laid-open Publication No. HEI-4-230996 introduces techniques of forming an oxide coating film on sulfide phosphor particles through fluidized-bed CVD, and points out that exposure of the phosphor particles to a high temperature may lower the luminous intensity. It proposes phosphor particles having a high resistance against humidity, the phosphor particles being covered with a very thin (thickness being 0.1 µm to 3 µm, preferably 0.1 µm to 0.5 µm) oxide coating film by conducting hydrolysis reaction of oxide precursor at 25° C. to 170° C. on the surface of phosphor particles.

International Publication No. WO00/69986 (National Publication No. 2002-544365) proposes a method of forming a coating film on particles of micrometer size by mixing inorganic particles of a micrometer size with coating particles of nanometer size and firing the mixture

SUMMARY OF THE INVENTION

An object of the present invention is to provide highly durable phosphor, its manufacture method, and a light emitting device using the improved phosphor and a light emitting diode.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, according to one aspect of the present invention, there is provided a phosphor made of phosphor particles coated with an inorganic substance lamination, the lamination including: an inner coating layer that is relatively thin and transparent, formed by a first film forming method and coated on said phosphor particle; and an outer coating layer that is relatively thick and transparent, made of one or more of $SiO_2$, $Al_2O_3$ and SiON and having a thickness of about 10 nm to about 500 nm, formed by a second film forming method different from said first film forming method and coated on an outer surface of said phosphor particle having said inner coating thereon.

According to another aspect of the present invention, there is provided a light emitting device including: a blue or ultraviolet light emitting diode; and an organic resin body containing a phosphor, applied on the light emitting diode, wherein said phosphor is made of phosphor particles coated with inorganic substance lamination, the lamination including, an inner coating layer that is relatively thin and transparent, formed by a first film forming method and coated on said phosphor particle; and an outer coating layer that is relatively thick and transparent, made of one or more of $SiO_2$, $Al_2O_3$ and SiON, having a thickness of about 10 nm to about 500 nm, formed by a second film forming method and coated on an outer surface of said phosphor particle having said inner coating layer thereon.

According to still another aspect of the present invention, there is provided a method of manufacturing a phosphor including: forming an inner coating layer that is relatively thin and transparent by a first film forming method on phosphor particles; and forming an outer coating layer that is relatively thick and transparent, made of one or more of inorganic substances $SiO_2$, $Al_2O_3$ and SiON and having a thickness of about 10 nm to about 500 nm, by a second film forming method different from said first film forming method, on said phosphor particles having said inner coating layer thereon.

In another aspect, the present invention provides a light conversion material, including light conversion particles that convert light of a first spectrum to light of a second spectrum; for each of the light conversion particles, a first layer covering a substantially entire surface of the light conversion particle; and for each of the light conversion particles, a second layer covering a substantially entire surface of the first layer.

In another aspect, the present invention provides a light emitting device, including a light emitting diode for emitting light of a first spectrum; and a host element over the light emitting diode, the host element including a light conversion element, wherein a light conversion element includes light conversion particles that convert said light of the first spectrum to light of a second spectrum; for each of the light conversion particles, a first layer covering a substantially entire surface of the light conversion particle; and for each of the light conversion particles, a second layer covering a substantially entire surface of the first layer.

Improved phosphor is provided having an improved moisture proof property and the performance less deteriorated even after a long term usage. A while light source can be realized having excellent color rendering and high reliability.

In this application, the term "phosphor" means any light conversion element/material that can covert, in part or entirely, source light into light of a different wavelength, and encompasses any luminescence, fluorescence, phosphorescence and similar light conversion particles/materials as well as light conversion element/particles that include additional non-active elements, such as coatings. It should be apparent that, depending on the context, the term "phosphor" may also indicate a particular light conversion material, such as a specific example of phosphorescence or fluorescence material/particle.

It is to be understood that both the foregoing general description and the following detailed description are exemplary and explanatory, and are intended to provide further explanation of the invention as claimed

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings:

FIG. 1A is a schematic cross sectional view showing the structure of a fluidized bed CVD system, FIGS. 1B, 1C and 1D are schematic cross sectional views showing the structures of phosphor particles of samples S1, S2 and S3, and FIG. 1E is a table showing the results of current flow tests of samples S1, S2 and S3.

DESCRIPTION OF THE PREFERRED EMBODIMENTS

Figure 2A:
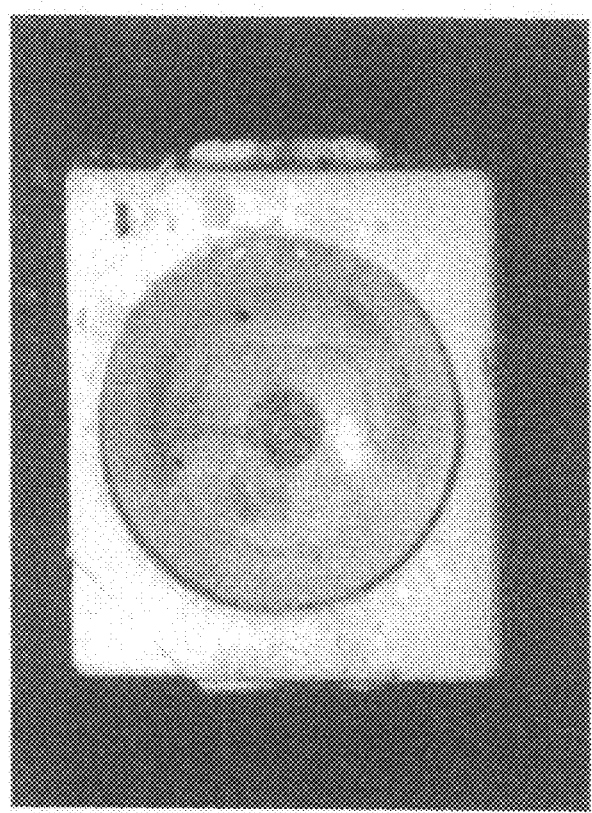
FIGS. 2A and 2B are photographs showing appearances of samples S1 and S2.

It is known that sulfide phosphors such as $Sr_{1-x}Ca_xS$:Eu can produce emission having a very narrow spectrum width and a high luminous intensity through excitation of source light, e.g., light with a peak wavelength of 460 nm, of a visible light emitting diode (LED). However, these sulfide phosphors have much deterioration in the performance after a long term usage. Sulfide phosphors may be decomposed by the influence of water content, particularly aqueous vapor, and reduce their luminance, and the decomposed S adversely affects the electrodes and the like of LED. The present inventors have studies oxide coating films on the surface of red phosphor particles $Sr_{1-x}Ca_xS$:Eu, which are particularly weak against moisture, in order to improve their moisture proof property.

FIG. 1A shows the outline structure of a fluidized bed CVD system used for forming micro capsules of silicon oxide, each containing a phosphor particle. A reaction vessel R is equipped with upper and lower filters F2 and F1 which will not transmit phosphor particles but transmit gas. For example, the filter has the structure of a metal mesh of stainless with small holes or fibers. A heater H is provided outside the reaction vessel R to heat the inside of the reaction vessel R. A gas inlet IN1 is formed in the lower portion of the reaction vessel R to introduce heated nitrogen gas or dried air. Gas inlets IN2 and IN3 are formed in the middle portion of the reaction vessel to introduce reaction gases. A bubbler B1 accommodates silicon tetrachloride ($SiCl_4$), bubbles the silicon tetrachloride with $N_2$ gas, and supplies the nitrogen gas containing silicon tetrachloride from the gas inlet IN2 to the reaction vessel R. A bubbler B2 accommodates pure water ($H_2O$), bubbles pure water with nitrogen gas $N_2$, and supplies the $N_2$ gas containing water content from the gas inlet IN3 to the reaction vessel R.

$Sr_{1-x}Ca_xS$:Eu red phosphor particles of 300 to 500 g are accommodated in a space between the filters F1 and F2 of the reaction vessel. A heated nitrogen gas or dried air is introduced at 5 to 20 $m^3$/h via the gas inlet IN1 to form a state that phosphor particles P are winded up (floating in the gas). The temperature in the reaction vessel is raised to about 80° C. to about 250° C., nitrogen gas containing silicon tetrachloride is introduced from the bubbler B1 at about 50 cc/min to about 500 cc/min, and at the same time an $N_2$ gas bubbled in boiled pure water in the bubbler B2 is introduced via the gas inlet IN3 at about 100 cc/min to about 500 cc/min. In this state, chemical vapor deposition is carried out in the reaction vessel for about 2 to 10 hours to cover the surface of each phosphor particle with an $SiO_2$ film. A thickness of an inorganic film coated in this manner was 10 nm to 500 nm. The sample formed by this method is designated as sample S1. For comparison, a sample without coating is also prepared as sample S2.

While a silicon oxide film is coated on the surfaces of $Sr_{1-x}Ca_xS$:Eu phosphor particles by fluidized bed CVD using $SiCl_4$ and $H_2O$, HCl is generated during a reaction process by Cl derived from $SiCl_4$ and H derived from $H_2O$. The present inventors have realized that HCl adversely affects phosphors. The present inventors have studied undercoating, which is performed before coating by fluidized bed CVD, in order to obtain phosphors more excellent in stability, as follows.

It can be considered that a thin undercoating may be sufficient for this purpose. First, a nonaqueous coating not using and not containing moisture was studied because moisture may deteriorate phosphors. A first target was a coating using particles of a nanometer size. Particles to be coated may be super-fine particles of $SiO_2$ having a diameter of about several nm to several tens nm in the initial state. Such super-fine particles have a large surface energy and a tendency of reducing a surface area. Therefore, the super-fine particles can be sintered to form coatings on subject particles at a lower temperature than their corresponding bulk. By utilizing this feature, an $SiO_2$ layer is coated on the surfaces of phosphors.

Specifically, nano-silica having a particle diameter of about 10 nm is mixed at 10 wt % with a red phosphor SrCaS:Eu having a particle diameter of about 10 μm. An alumina ball having a diameter of about 10 mm is accommodated in a cylindrical plastic container, together with the phosphor particles and nano-silica particles, and milled for about 30 minutes. If these particles are milled too strongly, phosphor particles may be damaged. After the milling, the PL (photoluminescence) intensities of the phosphor were measured, and there was no change in the PL intensities. It can be considered that super-fine particles of nano-silica are attached in a uniformly dispersed manner on the surfaces of phosphor particles. The phosphor particles attached with nano-silica are accommodated in a quartz boat, which is then set in the center of a quartz tube having a diameter of 100 mm of an electric furnace. A nitrogen gas is flowed in advance through the quartz tube. The flow rate is about 500 sccm for the tube having a diameter of 100 mm.

Thereafter, the electric furnace is heated to a sintering temperature. This state is maintained for about 60 minutes at a sintering temperature of about 800° C. After the sintering anneal, the electric furnace is turned off, and is left in that condition until the temperature falls to the room temperature. Meanwhile, the nitrogen gas is maintained to flow continuously. Since this coating method can be performed in a nonaqueous state, silicon oxide coating that does not contain water content can be formed. Under the above conditions, a silicon oxide film having a thickness of about 20 nm was formed on the phosphor particles. For this coating method, reference may be made to International Publication No. WO00/69986 (National Publication No. 2002-544365), the whole contents of which are incorporated herein by reference, in particular Detailed Description of the Embodiments.

A silicon oxide film having a thickness of about 200 nm to 500 nm is then coated by fluidized bed CVD on the surface of each phosphor particle coated with the thin silicon oxide film. The resulting phosphor is designated as sample S3.

FIG. 1B is a schematic diagram showing the structure of a phosphor particle S1 coated with a silicon oxide film by fluidized bed CVD. The silicon oxide coating film 12 is formed on the whole surface of a red phosphor particle 11.

FIG. 1C is a schematic diagram showing the structure of a phosphor S2 not coated with a silicon oxide film. The surface of the phosphor particle 11 is exposed directly in its bare state.

FIG. 1D is a schematic diagram showing the structure of a phosphor particle S3 formed with lamination of an inner silicon oxide film formed by a nonaqueous film forming method using nano-silica and an outer silicon oxide coating film formed by fluidized bed CVD. The silicon oxide coating film 13 is formed on the whole surface of the red phosphor particle 11 by the nonaqueous film forming method, and the silicon oxide coating film 12 is formed on the surface of the silicon oxide coating film 13 by the fluidized bed CVD.

The red phosphor S1 coated with the silicon oxide film by the above-described fluidized bed CVD was mixed at 5 wt % with an epoxy resin, and the red phosphor S3 having a lamination of an inner silicon oxide coating film formed by the nonaqueous film forming method and an outer silicon oxide film formed by the fluidized bed CVD on the inner oxide coating film was mixed at 5 wt % with an epoxy resin. Light emitting devices were formed by having a blue light emitting diode sealed with the respective epoxy resins.

For comparison, an epoxy resin mixed with the red phosphor S2 without coating was used to form a light emitting device. These light emitting devices of three types were placed in the environment of a high temperature and high humidity of 85° C. and 85% humidity and continuous power feeding was conducted at a drive current of 20 mA. Here, only red phosphors are mixed with the epoxy resin at an amount equivalent to the total amount of phosphors of green and red for forming a white light emitting diode, for the purpose of anti-moisture test. The color of the emitting light is not considered.

Table shown in FIG. 1E shows changes in the luminance under this continuous power feeding condition. Luminance values at an initial state, after a lapse of 545 hours and after a lapse of 1190 hours are indicated by relative values to the initial luminance. The luminance of sample S2 without silicon oxide coating lowered to 65% of the initial luminance after 545 hours, and lowered to 50% after 1190 hours.

In contrast, the luminance of sample S1 with a silicon oxide coating film having a thickness of 400 nm formed on phosphor particles by fluidized bed CVD became 80% of the initial luminance after 545 hours and became 65% after 1190 hours. As compared to sample S2, deterioration is suppressed to some extent, but reduction of luminance is recognized clearly also for sample S1.

The luminance of sample S3 with a lamination of an inner silicon oxide coating film having a thickness of 20 nm formed by the nonaqueous film forming method and an outer silicon oxide film having a thickness of 400 nm formed by the fluidized bed CVD retained 95% of the initial luminance after 545 hours and retained 80% even after 1190 hours. The data indicates that phosphors with less luminance deterioration and excellent in moisture proof property can be obtained by lamination coating on phosphor particles.

Electrodes of the light emitting device are plated with Ag in order to improve light output from the light emitting device. If sulfur is decomposed from the phosphor and sulfidizes the Ag surface, the reflectivity of the Ag electrode is lowered.

Figure 2B:
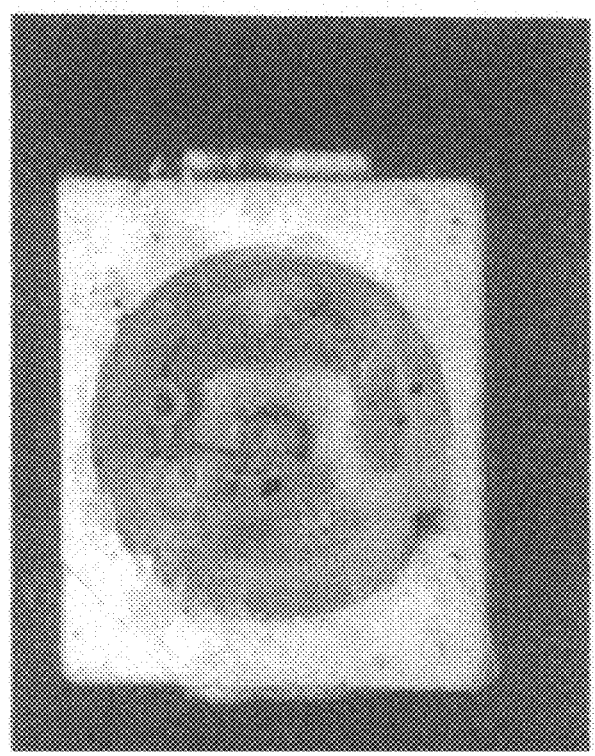

FIGS. 2A and 2B show photographs of the appearance of the light emitting devices using samples S1 and S2, respectively, after power feeding for 1190 hours. Sulfidization is clearly recognized in Sample S2, whereas sample S1 maintains a clear surface. The luminance data above indicates that the surface of sample S3 is even clearer.

Silicon oxide coating has been described above. In forming an inner (under) coating film by using particles of a nanometer size, the material can be selected from various materials if particles of a nanometer size can be obtained. When moisture proof property is taken into consideration, the material may preferably be one of or any combination of $TiO_2$, $Al_2O_3$, $SiO_2$ and SiON.

The material of the main (upper) coating formed by fluidized bed CVD may preferably be one of or any combination of $Al_2O_3$, $SiO_2$ and SiON. The deterioration of the luminance can further be suppressed by selecting appropriate inorganic material(s) for coating. Silicon oxynitride (SiON), alumina ($Al_2O_3$), and any combination of these materials may preferably be utilized to produce superior moisture proof properties.

If an alumina film is to be coated by fluidized bed CVD, trimethylaluminum (alumina precursor) as a source material may be vaporized in an inert gas and introduced into a fluidized bed CVD system in which water vapor and phosphor particles are accommodated. The alumina film may be formed by reacting water vapor and the alumina precursor on the surfaces of phosphors. The reaction temperature may be about 150° C. to about 250° C.

In another embodiment, after the inner layer is formed by a nonaqueous film forming method, an additional intermediate layer may be formed by another method and thereafter the outer (main) layer may be formed by fluidized bed CVD. For example, an intermediate layer of silicon oxide may be formed by a sol-gel method. In forming a silicon oxide film by a sol-gel method, phosphor particles may be mixed in solution of alkoxide dissolved in alcohol, and $Si(OH)_4$+ $4C_2H_5OH$ may be generated from $Si(OC_2H_5)_4$+$4H_2O$ on the surfaces of phosphor particles and processed at a temperature of about 100° C. to about 250° C. to generate $4SiO_2$+$2H_2O$ from $Si(OH)_4$ to form a silicon oxide coating film. A sol-gel method using polysilazane can also be used as a source material. In this case, sintering temperature may be about 200° C. to about 500° C. Because these methods require certain water content when a film is formed, water may be left in the resulting coating film. However, these methods can achieve better results as compared with the case in which phosphors are deteriorated by direct reaction of HCl with the phosphor surfaces.

The above-described transparent inorganic oxides typically have an absorption edge wavelength of 300 nm or shorter and are transparent to a wavelength of 460 nm of excitation light and to a wavelength of 630 nm of emission of $Sr_{1-x}Ca_xS:Eu$. Emission from a blue or ultraviolet LED can be transmitted and emission of red phosphors can be transmitted through these oxides. Therefore, they can prevent water vapor from passing through without adversely affecting the luminance, thereby effectively preventing performance degradation.

Figure 3:
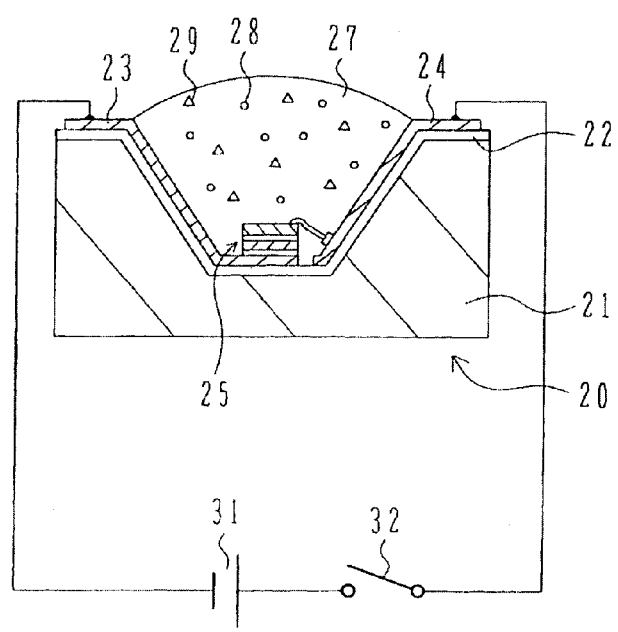
FIG. 3 is a schematic cross sectional view showing a structure of a white light source using a light emitting diode.

FIG. 3 is a schematic cross sectional view showing a structure of a white light source using a light emitting diode. A silicon package 20 has a recess which is, for example, made by anisotropically etching a (100) Si substrate 21 to form (111) slanted side surfaces. A silicon oxide film 22 is formed on the surface of the Si substrate 21 by thermal oxidation. Electrodes 23 and 24 functioning also as reflection mirrors are formed on the silicon oxide film 22. An InGaN-series blue light emitting diode 25 using a conductive SiC substrate, for example, is die-bonded to the electrode 23. The surface side electrode of the light emitting diode is wire-bonded to the other electrode 24. A power supply 31 is connected via a switch 32 to the electrodes 23 and 24. An epoxy resin body 27 mixed with phosphors 28 and 29 at e.g., 5 wt % in total buries the light emitting diode 25 and fills the recess. The resin body 27 may be shaped in lens shape. Depending on the material of the phosphors 28 and 29, appropriate materials other than epoxy resin may be used to host the phosphors. The phosphor 28 is a $Sr_{1-x}Ca_xS:Eu$ red phosphor having the above-described lamination coating, and the phosphor 29 is, for example, a $Sr_{1-x}Ca_xGa_2S_4:Eu$ green phosphor. Blue light is radiated from the light emitting diode 25, red light R emerges from the phosphor 28 and green light G emerges from the phosphor 29. Since light of RGB three colors are generated, white light having good color rendering can be obtained. In place of the blue light emitting diode, an ultraviolet light emitting diode may be used. Phosphors of three or more types may be mixed in the resin.

Phosphors to be coated is not limited to the red phosphor $Sr_{1-x}Ca_xS:Eu$, which has weak moisture resistance. Coating of silicon oxide or the like on the green phosphor $Sr_{1-x}Ca_xGa_2S_4:Eu$, for example, is also advantageous. This is because sulfide may be decomposed from bare phosphor $Sr_{1-x}Ca_xGa_2S_4:Eu$, adversely affecting electrodes or the like.

The ratio of the phosphors to be mixed with epoxy resin is not limited to 5 wt %, but may be about 3 wt % to about 7 wt % or in other ranges, depending on design needs. The weight ratio between green phosphors and red phosphors may preferably be a range of 60:40 to 80:20. But other ratios are possible. Although an illumination light source using a light emitting diode usually is designed to emit while light, it may be lightly colored, as bluish white or yellowish white. Such slightly colored light is also referred to as white light in this disclosure. The amounts of respective phosphors and the total amount of the phosphors relative to the resin weight are appropriately adjusted to produce desired spectrum in the output light.

A white light emitting device mixed with green and red phosphors has three primary colors in emission light components so that a back light excellent in color purity can be realized. A white light emitting device combining a blue LED and a yellow phosphor typically emits light having broad blue, green and red spectrum. However, the white light emitting device having emission components of blue, green and red has a narrow emission spectrum width for each of three primary colors, resulting in better color purity. It is therefore possible to provide a back light excellent in color rendering, reproducibility and reliability. If color filters are used, it is effective to combine appropriate phosphor(s) such that the emission wavelength(s) of the phosphor(s) corresponds to the characteristics of color filters.

The present invention has been described in connection with the preferred embodiments. The invention is not limited to the above embodiments. For example, the emission wavelength of a blue light emitting diode is not limited to a wavelength near 460 nm, but a blue light emitting diode having an emission wavelength of about 400 nm to about 470 nm may also be used. It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents

What we claim are:

1. A phosphor made of phosphor particles coated with inorganic substance lamination, the lamination comprising:

an inner coating layer that is relatively thin and transparent, formed by a first film forming method and coated on said phosphor particle; and an outer coating layer that is relatively thick and transparent, made of one or more of $SiO_2$, $Al_2O_3$ and SiON, having a thickness of about 200 nm to about 500 nm, formed by a second film forming method different from said first film forming method and coated over an outer surface of said phosphor particle having said inner coating layer thereon, wherein said second film forming method is fluidized bed CVD, wherein said first film forming method is a nonaqueous method coating nanometer sized particles and sintering, wherein said inner coating layer includes at least one of $TiO_2$, $Al_2O_3$, $SiO_2$ and SiON, and wherein said phosphor particles include at least one of $Sr_{1-x}Ca_xS:Eu$ and $Sr_{1-x}Ga_2S_4:Eu$.

2. The phosphor according to claim 1, wherein the thickness of the inner coating layer is about 20 nm.

3. A light emitting device comprising:

a blue or ultraviolet light emitting diode; and a host element containing a phosphor, over the light emitting diode, wherein said phosphor is made of phosphor particles coated with inorganic substance lamination, the lamination comprising:

an inner coating layer that is relatively thin and transparent, formed by a first film forming method and coated on said phosphor particle; and an outer coating layer that is relatively thick and transparent, made of one or more of $SiO_2$, $Al_2O_3$ and SiON, having a thickness of about 200 nm to about 500 nm, formed by a second film forming method and coated over an outer surface of said phosphor particle having said inner coating layer thereon, wherein said second film forming method is fluidized bed CVD, wherein said first film forming method is a nonaqueous method coating nanometer sized particles and sintering, wherein said inner coating layer includes at least one of $TiO_2$, $Al_2O_3$, $SiO_2$ and SiON, and wherein said phosphor particles include phosphor particles made of $Sr_{1-x}Ca_xS:Eu$ and phosphor particles made of $Sr_{1-x}Ga_2S_4:Eu$.

4. The light emitting device according to claim 3, wherein said phosphor is mixed in said host element at a weight percent between about 3 wt % and about 7 wt %.

5. The light emitting device according to claim 4, wherein a weight ratio between said phosphor particles made of $Sr_{1-x}Ca_xS:Eu$ and said phosphor particles made of $Sr_{1-x}Ca_xGa_2S_4:Eu$ is within about 60:40 to about 80:20.

6. The light emitting device according to claim 3, further comprising:
a package comprising a support substrate made of silicon and having a recess with a bottom surface and slanted side surfaces, an oxide film formed on a surface of said support substrate, and a pair of reflecting-electrodes formed on the oxide film in the recess and electrically separated by each other,
wherein said light emitting diode is bonded to one of the pair of reflecting electrodes in the recess, and the phosphor contains $Sr_{1-x}Ca_xS:Eu$ and $Sr_{1-x}Ca_xGa_2S_4:Eu$, and
wherein said host element includes an organic resin and fills the recess over the light emitting diode.

7. The light emitting device according to claim 3, wherein the thickness of the inner coating layer is about 20 nm.

* * * * *